United States Patent
Fujino

[11] Patent Number: 5,877,505
[45] Date of Patent: Mar. 2, 1999

[54] APPARATUS FOR DETERMINING MARK POSITION ON WAFER

[75] Inventor: Takeshi Fujino, Hyogo, Japan

[73] Assignee: Mitsubishi Denki Kabushiki Kaisha, Tokyo, Japan

[21] Appl. No.: 967,256

[22] Filed: Nov. 6, 1997

Related U.S. Application Data

[63] Continuation of Ser. No. 627,654, Apr. 4, 1996, abandoned.

[30] Foreign Application Priority Data

Jun. 12, 1995 [JP] Japan .................................. 7-144536

[51] Int. Cl.[6] .................................................. G01N 23/00
[52] U.S. Cl. .................................. 250/491.1; 250/492.23
[58] Field of Search .................................. 356/399–401, 356/375, 376; 250/548, 491.1, 491.2, 492.23, 492.22, 492.3, 398, 399; 355/43, 53; 438/16

[56] References Cited

U.S. PATENT DOCUMENTS 5,172,189   12/1992   Mitome .................................... 356/401
5,468,969   11/1995   Itoh et al. ........................... 250/492.23

FOREIGN PATENT DOCUMENTS 5853703   3/1983   Japan ..................................... 356/375
6-82607   10/1994   Japan .

OTHER PUBLICATIONS

"Improved Registration Accuracy in E–Beam Direct Writing Lithography," by Yoshikatsu KOJIMA et al., *Jpn. J. Appln Phys.*, vol. 32, Part 1, No. 12B, Dec. 1993.

Primary Examiner—K. P. Hantis
Attorney, Agent, or Firm—McDermott, Will & Emery

[57] ABSTRACT

In an apparatus scanning an alignment mark formed on a silicon substrate by an electron beam to determine the center position of the alignment mark based on the reflected signal waveform, a proportional relationship holds between a beam size which is the thickness of the electron beam and the amount of offset between the detected mark position and the actual mark position. More specifically, when the beam size is small, the amount of offset of the detected position from the actual position is small. In the mark position determining apparatus according to the present invention, the alignment mark is detected a plurality of times by the electron beams having a plurality of sizes, and based on the mark detection positions obtained by the respective detections, the mark detection position when scanning is carried out by an electron beam having a beam size of 0 is calculated.

22 Claims, 15 Drawing Sheets

SCANNING DIRECTION

APPARATUS FOR DETERMINING MARK POSITION ON WAFER

This application is a continuation of application Ser. No. 08/627,654 filed Apr. 4, 1996 now abandoned.

BACKGROUND OF THE INVENTION

1. Field of the Invention

The present invention relates to an apparatus and a method for determining a mark position on a wafer, and more particularly, to an apparatus and a method for determining a mark position used in delineating a plurality of registered patterns using a beam such as an electron beam in lithography of semiconductor device fabrication.

2. Description of the Background Art

In lithography of semiconductor device fabrication, a pattern generation apparatus is conventionally known. This apparatus prestores a desired pattern in a storage device, and delineates the stored pattern by electron beam exposure on a silicon substrate, which is coated with resist and mounted on a stage. In lithography of semiconductor device fabrication, 10 to 30 patterns such as a pattern for forming an oxide film and a pattern for forming a gate electrode of a transistor must be registered. In order to register the patterns, the position of an alignment mark which is a groove formed on the silicon substrate must be determined. The position of a pattern formed in the previous step is determined by the position of the alignment mark. In the recent development of LSI whose patterns get smaller, the patterns must be registered with high accuracy of 0.1 $\mu$m or less. Therefore, extremely high accuracy is required for detection of the alignment mark.

Information on an electron signal reflected from the silicon substrate irradiated with an electron beam is different between in a portion including the alignment mark and in a portion not including the alignment mark. In determination of the position of the alignment mark, this difference is used. More specifically, the vicinity of the alignment mark on the silicon substrate is scanned by the electron beam and the position of the mark is determined based on a reflected electron signal detected by scanning.

FIG. 13 shows a specific structure of a conventional apparatus for determination of an alignment mark position.

Referring to FIG. 13, a silicon substrate 126 having resist 125 is irradiated with an electron beam 103 emitted from an electron gun (not shown). Information on an electron signal reflected from silicon substrate 126 irradiated with electron beam 103 is detected by a reflected signal detector 106. Electron beam 103 is deflected by a beam deflector 104 constituted of opposing electrodes, and scans the vicinity of an alignment mark 111 of silicon substrate 126 depending on the degree of deflection. The intensity of the reflected electron signal indicates a curve shown in FIG. 14. In this figure, the distance for which the beam moves on a line including the alignment mark on the silicon substrate by scanning is plotted along the abscissa, and the intensity of the electron signal reflected from the silicon substrate is plotted along the ordinate. This curve is generally called a reflected signal waveform. When the line including the alignment mark is scanned as shown in FIG. 14, ideal reflected signal waveform 113 is in symmetry. The level of waveform 113 is high in a portion not including the alignment mark and low in a portion including the alignment mark. By finding the center position of the symmetrical reflected signal waveform, the center position of the alignment mark is determined. The position of the silicon substrate is determined by an output from a laser interferometer, and the position at which the silicon substrate is irradiated with the electron beam is determined by a voltage applied to beam deflector 104. Since the alignment mark is formed by a groove having a depth of approximately 0.1 to 1.0 $\mu$m as shown in FIG. 13, resist 125 becomes thick in the portion of the groove, and the distance to the substrate from which the electron is reflected becomes long. Therefore, electrons lose energy in resist 125 in their path. This is the reason why the level of the reflected signal waveform in the portion including the alignment mark becomes low.

A "threshold method" and an "autocorrelation method" are employed as a method for calculating the center position of the alignment mark based on the reflected signal waveform shown in FIG. 14. These methods will be described.

FIG. 15 shows the reflected signal waveform converted into an electric signal by detector 106, and FIG. 16 is a diagram for describing the signal processing of the reflected signal waveform by the threshold method.

Referring to FIG. 15, the intensity of a signal 114 reflected from the portion including the alignment mark (groove) tends to be smaller than that of a signal 127 reflected from the region not including the alignment mark (hereinafter referred to as a "base line"). In the threshold method, a threshold level 115 is set at a height of 30 to 70%, when the minimum value of the signal reflected from the portion including the alignment mark is 0% and the base line is 100% as shown in FIG. 16. Then, crossing points 128a and 128b between threshold level 115 and reflected signal waveform 113 are calculated, and a center position 117 between two crossing points 128a and 128b is determined as the center position of the alignment mark.

On the other hand, in the autocorrelation method, the reflected signal waveform shown in FIG. 15 is digitally sampled and input to the apparatus. Here, assume that the digitally sampled waveform is D(X). The waveform D(X) is substituted in an autocorrelation function Z(X) shown by the following expression (1). The waveform indicated by Z(X) calculated according to the expression (1) is called an autocorrelation signal.

$$Z(X) = \sum_{I=t}^{W} (D(X-I) \times D(X+I)) \quad (1)$$

Note that in the expression (1), a variable W is arbitrarily set as a width a little larger than that of the alignment mark (groove). By the processing of the reflected signal waveform shown in FIG. 15 with the autocorrelation method according to the expression (1), the autocorrelation signal shown in FIG. 17 is calculated. The autocorrelation signal indicates a so-called centroid of the reflected signal waveform, peak position 119 of which is to be determined as the center position of the alignment mark.

However, in the above described apparatus for determining the alignment mark position, the center position of the alignment mark cannot be always determined accurately because of the following reason. As shown in FIG. 19A, in the actual lithography, a thin film 120 of atoms of platinum, tungsten or the like is sometimes formed between silicon substrate 126 and resist 125. Since the atoms of platinum or tungsten of thin film 120 have a large atomic number and a large density, the reflection coefficient of an electron is extremely large. Therefore, when the thickness of thin film 120 is different in the alignment mark portion as shown in FIG. 19A, the reflected signal waveform is in asymmetry as shown in FIG. 19B. More specifically, the intensity of the signal reflected from the thick portion of thin film 120 is relatively large, while that of the signal reflected from the thin portion of thin film 120 is relatively small. Therefore, center position 121 of the alignment mark calculated from reflected signal waveform 113 by the threshold method tends to shift towards the side of thin film 120 having a small thickness as shown in FIG. 19B. Similarly, also when the peak position is calculated by the autocorrelation method, the peak position shifts towards the side of thin film 120 having a small thickness as shown in FIG. 19C.

If thin film 120 is formed uniformly in symmetry in the alignment mark portion, such shift in the mark center position does not occur. However, as shown in FIG. 18, the thin film is currently formed with a spattering method. In the spattering method, a voltage is applied between silicon substrate 126 and a target 205, and the material of target 205 is deposited on silicon substrate 126 as a thin film. Therefore, thin film 120 at alignment mark 111 having a three-dimensional shape varies in thickness depending on its positional relationship with target 205. In an example shown in FIG. 18, the left portion of alignment mark 111 in the figure has a large thickness since the film is directly exposed to target 205, while the right portion of alignment mark 111 has a small thickness since this portion is shadowed by silicon substrate 126.

SUMMARY OF THE INVENTION

One object of the present invention is to provide a mark position determining apparatus capable of calculating the position of an alignment mark accurately even if there is a variation in thickness of a thin film formed on a silicon substrate.

Another object of the present invention is to provide a method for determining a mark position capable of calculating the position of an alignment mark accurately even if there is a variation in thickness of a thin film formed on a silicon substrate.

According to one aspect of the present invention, an apparatus determining the position of a mark formed on an object includes: a first detector scanning the mark by a beam having a first beam size and detecting a reflected signal waveform reflected from the mark; a second detector scanning the mark by a beam having a second beam size and detecting a reflected signal waveform reflected from the mark; and a determiner determining the position of the mark based on the reflected signal waveform obtained by the first detector and the reflected signal waveform obtained by the second detector.

According to another aspect of the present invention, an apparatus determining the position of a mark formed on an object includes: a detector scanning the mark by a beam and detecting a reflected signal waveform reflected from the mark; a detector obtaining a beam shape at a position at which the beam reaches the mark; and a determiner determining the position of the mark based on the detected reflected signal waveform and the obtained beam shape.

According to still another aspect of the present invention, a method for determining a position of a mark includes: a first step of scanning the mark by a beam having a first beam size and detecting a reflected signal waveform reflected from the mark; a second step of scanning the mark by a beam having a second beam size and detecting a reflected signal waveform reflected from the mark; and a third step of determining the position of the mark based on the reflected signal waveform obtained by the first step and the reflected signal waveform obtained by the second step.

According to a further aspect of the present invention, a method for determining a position of a mark includes: a step of scanning the mark by a beam and detecting a reflected signal waveform reflected from the mark; a step of obtaining a waveform at a position at which the beam reaches the mark; and a step of determining the position of the mark based on the detected reflected signal waveform and the obtained waveform.

The present invention is based on the relationship between a beam size and mark detection accuracy newly discovered by the inventor. More specifically, by determining a position of a mark based on two or more reflected signal waveforms obtained by scanning the mark by beams having two or more beam sizes, the mark position can be determined more accurately.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A–4E-1 are diagrams showing the reflected signal waveform and the autocorrelation signal.

DESCRIPTION OF THE PREFERRED EMBODIMENTS

Figure 1:
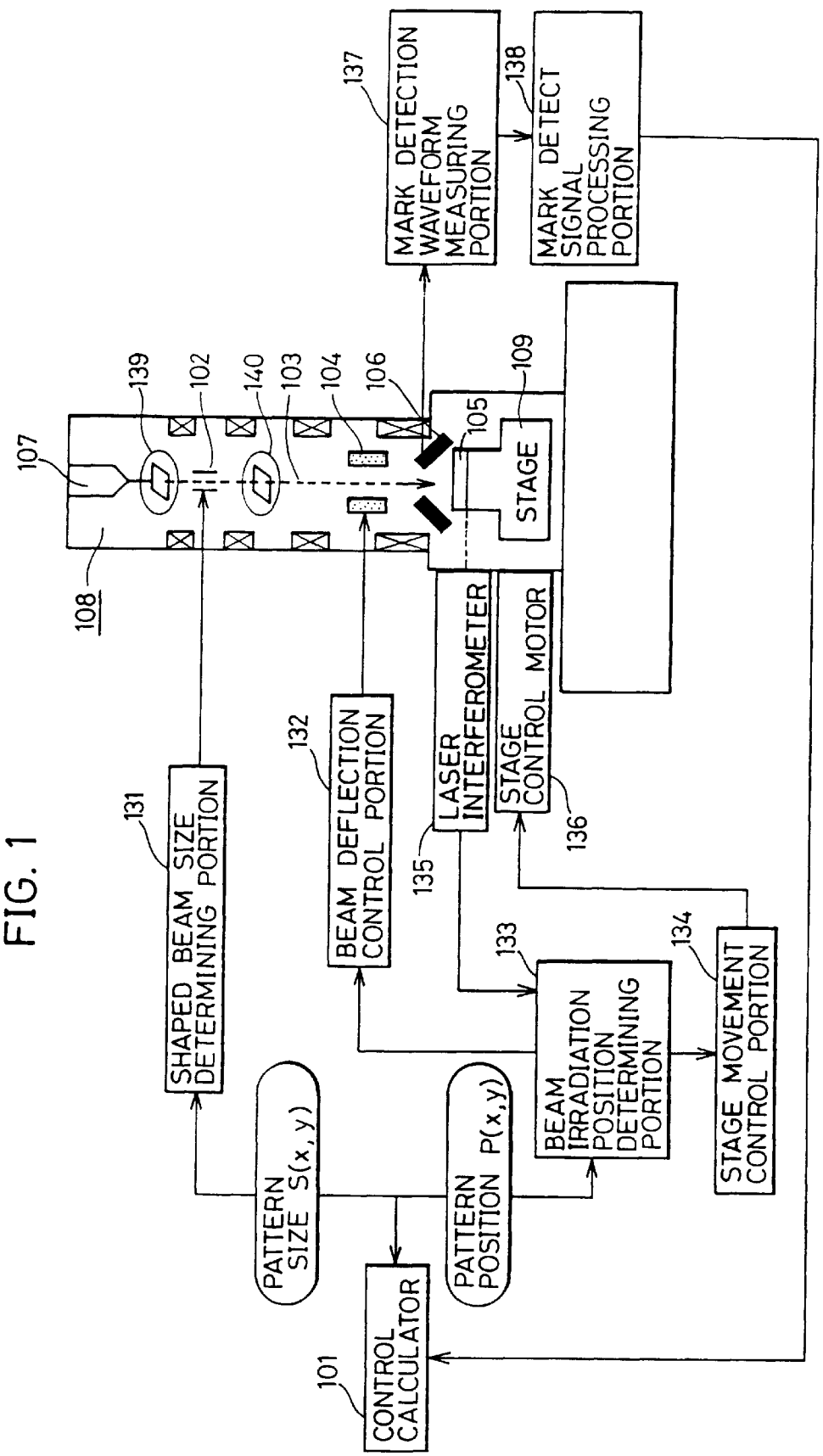
FIG. 1 is a block diagram showing a structure of a mark position determining apparatus according to a first embodiment of the present invention.

Embodiments of the present invention will be described hereinafter in detail with reference to the drawings, in which the same reference characters denote the same or corresponding portions.

(First Embodiment)

Referring to FIG. 1, a mark position determining apparatus according to the first embodiment has a vacuum chamber 108. Vacuum chamber 108 includes a workpiece 105 (for example, a silicon substrate having an alignment mark formed thereon), a stage 109 on which workpiece 105 is mounted, an electron gun 107 emitting an electron beam to workpiece 105, first aperture 139 shaping the electron beam emitted from electron gun 107, deflecting electrode 102 deflecting the electron beam passing through first aperture 139, second aperture 140 shaping the electron beam deflected by deflecting electrode 102, beam deflector 104 for deflecting electron beam 103 output from second aperture 140, and detector 106 detecting a signal reflected from workpiece 105 irradiated with the electron beam. Outside vacuum chamber 108, a stage control motor 136 for controlling stage 109 and a laser interferometer 135 for measuring the position of workpiece 105 are provided.

In order to control respective portions in vacuum chamber 108, provided are a control calculator 101 controlling the entire apparatus, a shaped beam size determining portion 131 determining the size of a shaped beam (which refers to a shaped electron beam) directed to workpiece 105 by receiving information on a pattern size S(x, y) output from control calculator 101 and controlling a voltage to be applied to deflecting electrode 102, a beam irradiation position determining portion 133 receiving information on a pattern position P(x, y) output from control calculator 101 to determine the position at which the workpiece is irradiated with the beam, a beam deflection control portion 132 controlling the position at which the workpiece is irradiated with the beam by receiving a signal output from beam irradiation position determining portion 133 and controlling a voltage to be applied to beam deflector 104, a stage movement control portion 134 moving workpiece 105 by receiving the signal output from beam irradiation position determining portion 133 and controlling stage control motor 136, a mark detection waveform measuring portion 137 receiving a signal output from detector 106 to measure the waveform of the signal, and a mark detection signal processing portion 138 receiving a signal from mark detection waveform measuring portion 137 to output a mark detect signal to control calculator 101.

Figure 2:
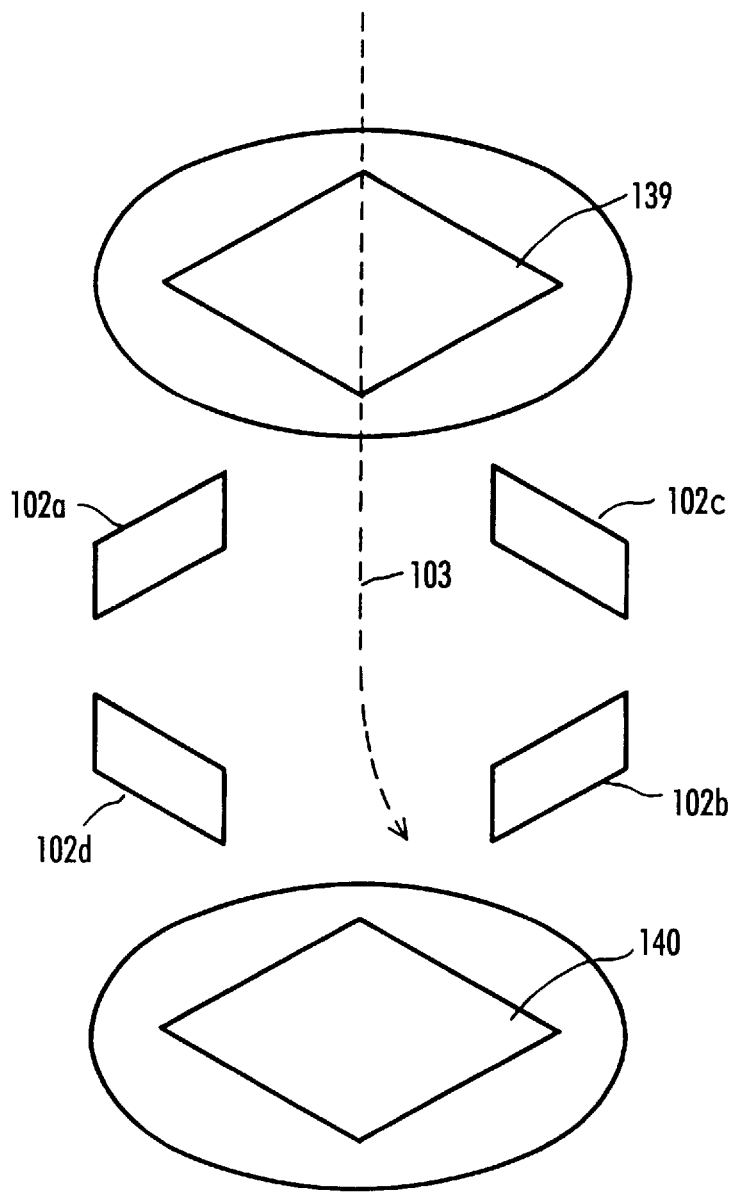
FIG. 2 is a perspective view showing a specific structure of a first aperture 139, a deflecting electrode 102, and a second aperture 140 of FIG. 1.
Figure 3:
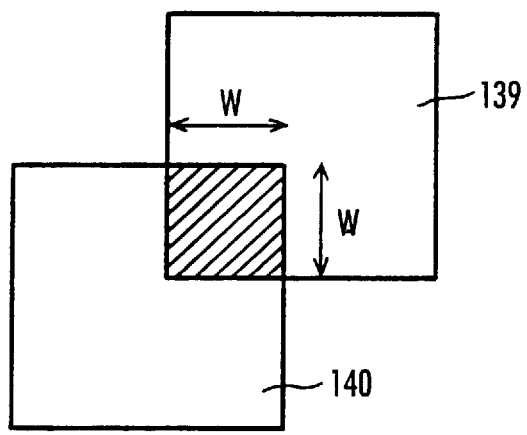
FIG. 3 is a diagram for describing a size W of a beam shaped by first aperture 139 and second aperture 140.

Referring to FIG. 2, a desired voltage is applied to respective sets of deflecting electrodes 102a and 102b, and 102c and 102d. Electron beam 103 emitted from electron gun 107 first passes through first aperture 139 to be formed into an electron beam having a square cross section. The electron beam having a square cross section output from first aperture 139 is deflected by the voltage applied to each of deflecting electrodes 102a to 102d, and then reaches second aperture 140. As a result, the electron beam output from second aperture 140 has a cross section of a shape of an overlap area of first aperture 139 and second aperture 140. More specifically, as shown in FIG. 3, among electrons passing through first aperture 139, only electrons of the hatched portion which can pass through second aperture 140 are to be provided. In this embodiment, an electron beam having a length (size) W of one side of a square forming a cross section shown by the hatched portion is to be provided from second aperture 140.

The mark position determining apparatus according to this embodiment is characterized by scanning an alignment mark by a plurality of electron beams having different sizes and calculating the center position of the alignment mark based on reflected signal waveforms obtained by the electron beams having respective sizes.

This is based on the inventor's findings that there is a following relationship between the beam size and mark detection accuracy.

In FIG. 4, a reflected signal waveform from an alignment mark having a groove step of 2.0 $\mu$m in width and an autocorrelation signal obtained based on the reflected signal waveform, when the thickness of a thin film is not uniform, are calculated by calculator simulation. Referring to FIGS. 4A to 4E, waveforms on the left side are reflected signal waveforms, and those on the right side show autocorrelation signals, when the beam size (the value of W shown in FIG. 3) is 0.3 $\mu$m, 0.5 $\mu$m, 1.0 $\mu$m, 1.5 $\mu$m, and 2.0 $\mu$m, respectively. The threshold value when the threshold method is used is together shown with the respective reflected signal waveforms on the left side. The distance showing the amount of offset between the mark center position calculated based on the waveform and the actual mark center position (hereinafter referred to as "the amount of offset") is indicated at the bottom right of the respective waveforms.

Referring to FIGS. 4A–4E, the following two relationships are recognized between the beam size and the amount of offset when scanning is carried out using the beam.

Relationship (1): The smaller the beam size is, the smaller the amount of offset is, both in the threshold method and in the autocorrelation method.

Relationship (2): The smaller the beam size is, the smaller the intensity of the signal is, both in the threshold method and in the autocorrelation method.

Figure 4A:
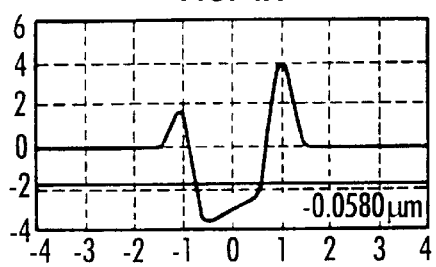
Figures 1, 4A:
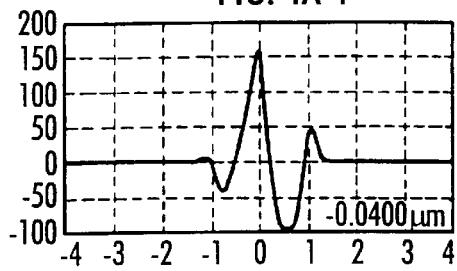
Figure 4B:
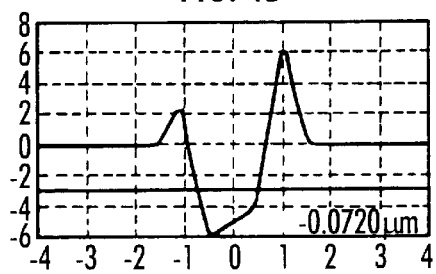
Figures 1, 4B:
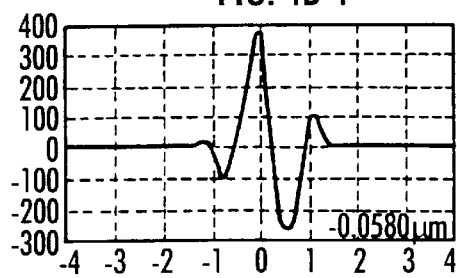
Figure 4C:
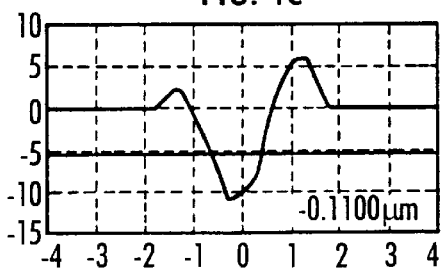
Figures 1, 4C:
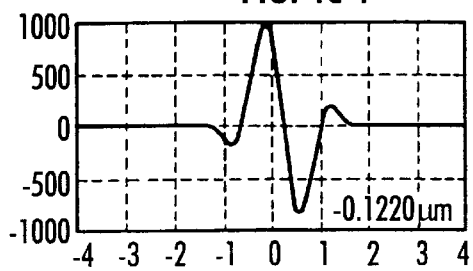
Figure 4D:
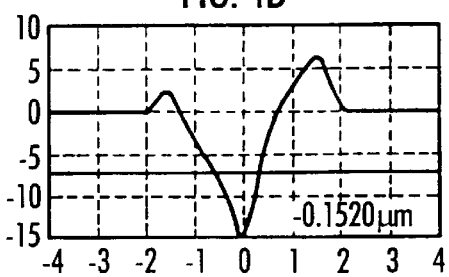
Figures 1, 4D:
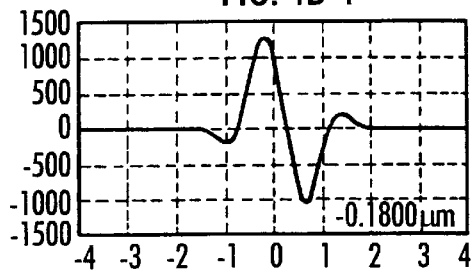
Figure 4E:
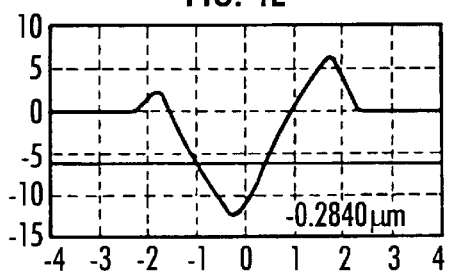
Figures 1, 4E:
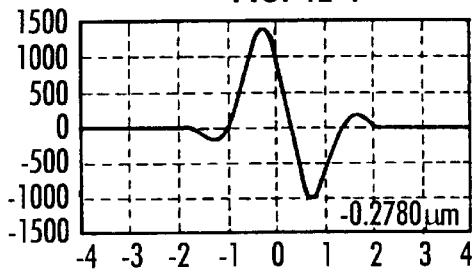

Because of the above described relationships (1) and (2), it was necessary to minimize a beam size in order to determine the center position of an alignment mark with high accuracy. However, when the beam size was decreased, the intensity of a detect signal became smaller, and the detect signal was disturbed by noise, resulting in reduction in mark detection accuracy. Therefore, it was difficult to carry out mark detection with high reproducibility using a scanning beam having a beam size of 0.3 $\mu$m or less in ordinary mark detection carried out conventionally. An electron beam having a beam size exceeding 0.3 $\mu$m was required. Therefore, the offset of approximately 0.05 to 0.1 $\mu$m was inevitably generated in the conventional detection, as shown in FIG. 4A.

Figure 5:
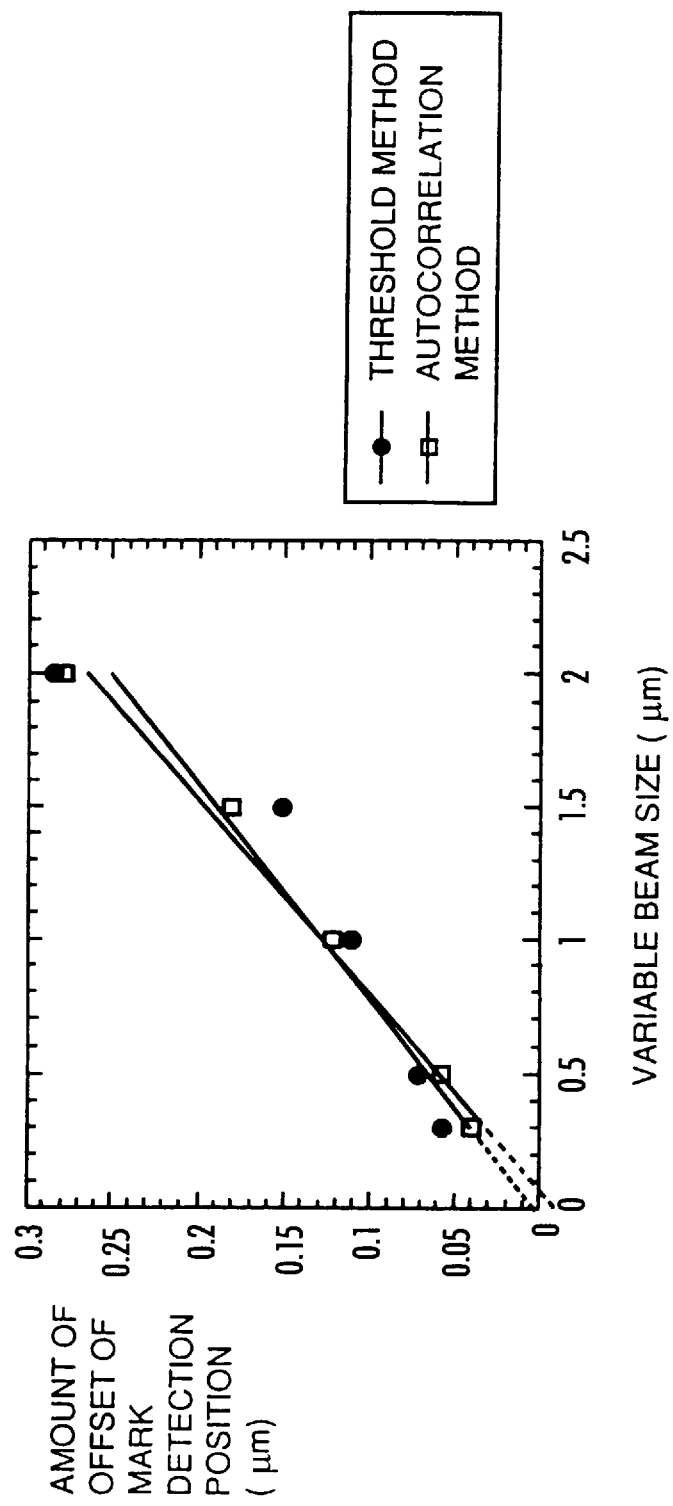
FIG. 5 is a diagram showing the relationship between the beam size and the amount of offset of the detected position of the alignment mark.

The proportional relationship has recently been discovered between the beam size and the amount of offset, as shown in FIG. 5. In the mark position determining apparatus in this embodiment, the size of the electron beam scanning the alignment mark is changed from approximately 0.3 $\mu$m to approximately 2.0 $\mu$m. The mark detection positions obtained by scanning by the beams of respective sizes are graphed. The gradient and the intercept of a linear line obtained by a least square method based on the respective points are calculated. According to the calculated gradient and intercept, the amount of offset of the mark detection position when the beam size is 0 μm is obtained by extrapolation. The obtained mark position is determined as the center position of the mark.

More specifically, an electron beam output from electron gun 107 is shaped and deflected by beam deflector 104, and scans an alignment mark of workpiece 105 mounted on stage 109. The size of shaped beam 103 is controlled by a voltage to be applied to deflecting electrode 102, which is output from shaped beam size determining portion 131 based on the pattern size S(x, y) output from control calculator 101. Further, based on the pattern position P(x, y) output from control calculator 101, beam irradiation position determining portion 133 controls a voltage to be applied to beam deflector 104 through beam deflection control portion 132 in order to scan the vicinity of the alignment mark.

The processing for determining the position of the alignment mark according to the present embodiment, which is carried out in control calculator 101 shown in FIG. 1, will be described more specifically with reference to a flow chart of FIG. 6.

Figure 6:
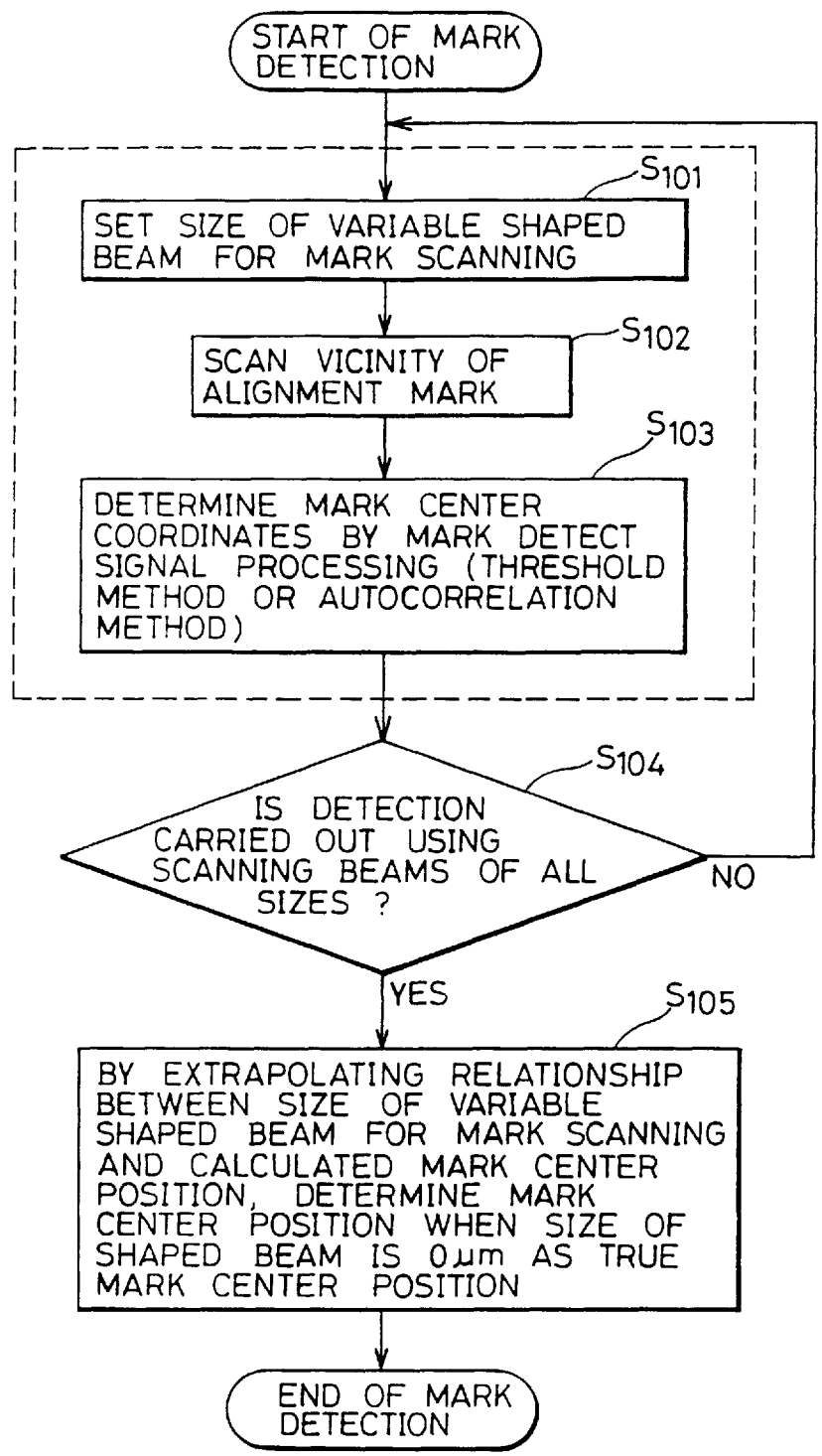
FIG. 6 is a flow chart showing the processing carried out by the mark position determining apparatus according to the first embodiment of the present invention.

Referring to FIG. 6, when mark detection is started, the size of a variable shaped beam for mark scanning is set by control calculator 101 in step S101. At this time, any size of 0.3 μm, 0.5 μm, 1.0 μm, 1.5 μm, and 2.0 μm is set as the size of the shaped beam, as shown in FIG. 5.

In step S102, the vicinity of the alignment mark is scanned by the beam having the set size.

In step S103, based on the reflected signal waveform obtained by scanning, the mark center coordinates are determined by the threshold method or autocorrelation method.

In step S104, it is determined whether or not the vicinity of the alignment mark is scanned by the scanning beams of all sizes, and if NO in step S104, the processing from step S101 to step S103 is repeated.

If YES in step S104, the relationship between the size of the variable shaped beam and the mark detection position is graphed in control calculator 101 in step S105. Based on the linear line obtained by the least square method, the mark center position when the electron beam size is 0 μm is determined as the center position of the alignment mark.

In the mark position determining apparatus according to the present embodiment, the error between the determined mark center position and the actual mark center position can be improved to 0.02 μm or less, allowing determination of the position of the alignment mark with extremely high accuracy.

[Second Embodiment]

As a mark position determining apparatus according to the second embodiment of the present invention is substantially the same as that of the first embodiment shown in FIG. 1 in structure, the description thereof will not be repeated. In the mark position determining apparatus in the second embodiment, an alignment mark formed on workpiece 105 is scanned by an electron beam having a beam size set by control calculator 101. Based on a reflected signal waveform and a beam shape of electron beam 103 when it reaches workpiece 105, reflected signal waveform 113 when scanning is carried out by an electron beam having a size of 0 μm is calculated, based on which the center position of the alignment mark is determined. Control calculator 101 obtains the beam shape when shaped beam 103 reaches workpiece 105. In order to obtain the beam shape, a method of actually measuring a waveform and a method of obtaining a waveform as a model function are considered. These methods will be described hereinafter.

Figure 7:
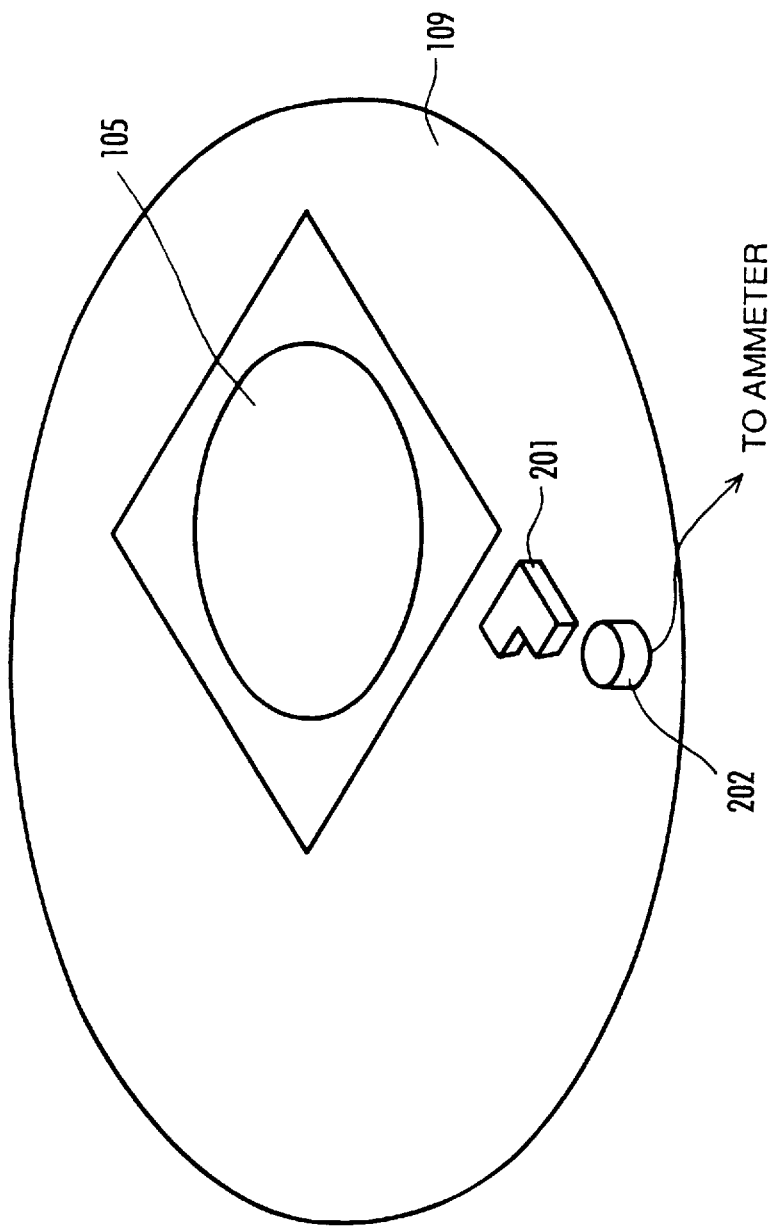
FIG. 7 is a perspective view showing a device for obtaining a beam waveform in a mark position determining apparatus according to a second embodiment of the present invention.
Figure 8:
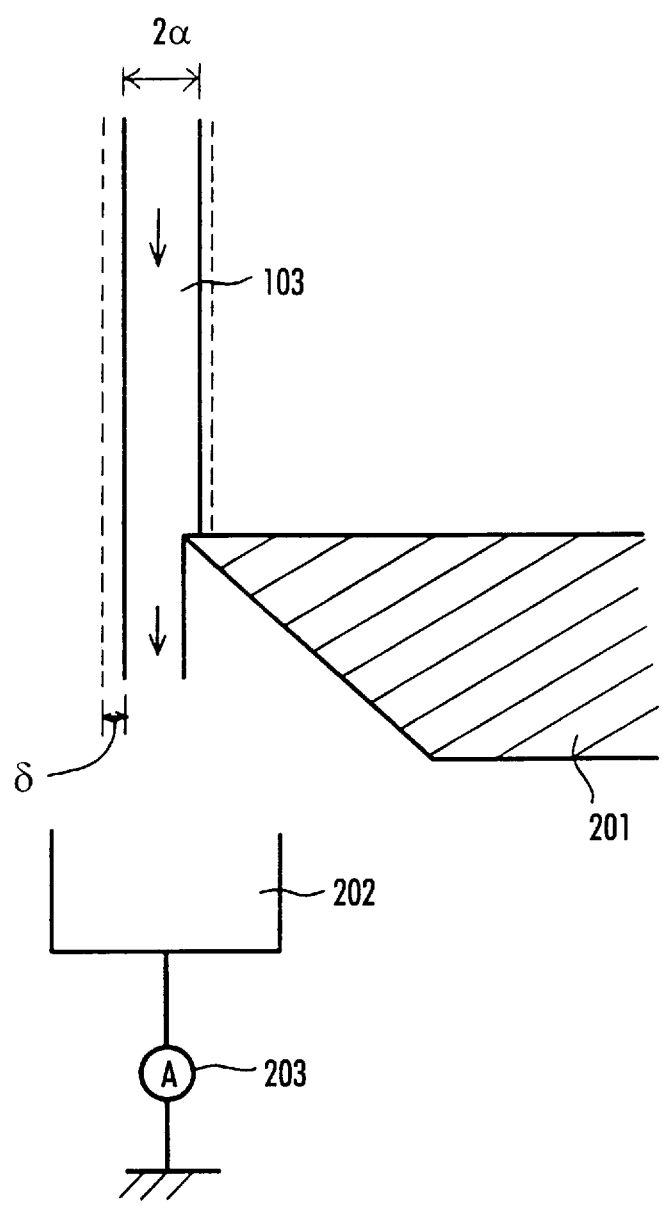
FIG. 8 is a diagram showing the state in which a beam shape is obtained by the device shown in FIG. 7.
Figure 9:
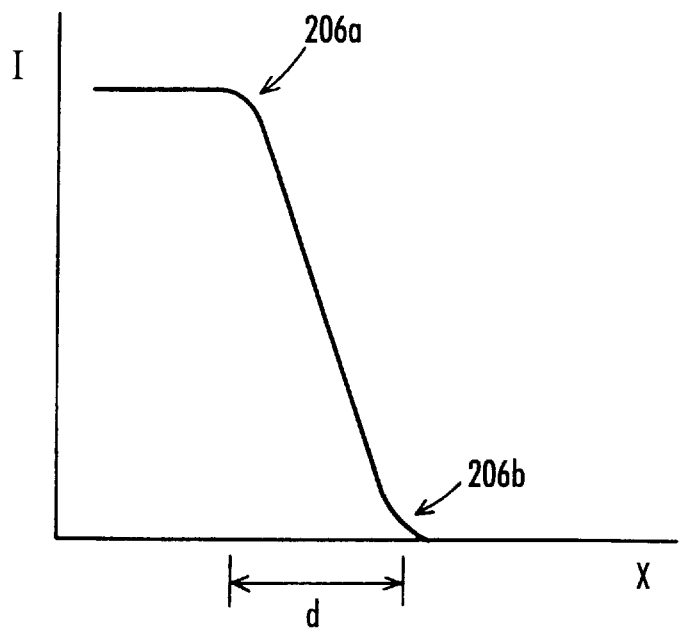
FIG. 9 is a diagram showing the relationship between a positional relationship x between a beam and a knife edge obtained by the processing shown in FIG. 8, and a current I detected by an ammeter.

In actually measuring the waveform, a waveform detecting device shown in FIG. 7 is mounted on stage 109 of FIG. 1 together with workpiece 105. The waveform detecting device is constituted of a knife edge 201 and a Faraday cup 202. More specifically, in the waveform detecting device, the amount of electrons which reach Faraday cup 202 among electrons included in electron beam 103 output from the electron gun is measured by an ammeter 203, as shown in FIG. 8. By moving stage 109 or electron beam 103, part of electron beam 103 is blocked by knife edge 201. As a result, the amount of electrons reaching Faraday cup 202 is changed depending on the relative positional relationship between knife edge 201 and electron beam 103. More specifically, based on the relative positional relationship x between knife edge 201 and electron beam 103 and a current measured by ammeter 203, such a graph as shown in FIG. 9 can be obtained. In FIG. 9, a range d in which the value of the current I changes indicates a portion where part of electron beam 103 is blocked by knife edge 201. A starting end 206a and an ending end 206b in the portion where electron beam 103 is blocked by knife edge 201 are curved, because electrons included in electron beam 103 are repulsed with each other in a period from emission from the electron gun to arrival at Faraday cup 202, and the size of electron beam 103 becomes wider than the actual beam size, causing in blur of the beam.

Figure 10:
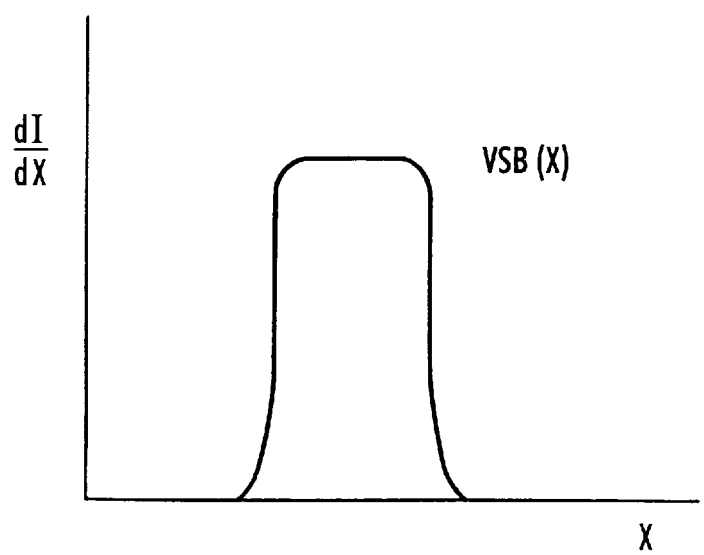
FIG. 10 is a diagram showing the relationship between the positional relationship x between beam 103 and knife edge 201 and a differentiated value of the current I detected by the ammeter derived from the relationship of FIG. 9.

FIG. 10 is a graph obtained by differentiating the current I with respect to the distance x in the relationship between the distance x and the current I shown in FIG. 9. A waveform VSB (x) shown in FIG. 10 is a waveform of the electron beam at the position where it arrives at the alignment mark. When the amount of blur of the beam is larger, this waveform draws a curve similar to the Gaussian distribution curve.

As the method for obtaining the waveform at the position where the electron beam reaches the alignment mark as a model function, the following expression (2) is used. In the expression (2), 2α is the width of the beam shown in FIG. 8, and δ is the amount of blur of the beam.

$$VSB(x) = \frac{1}{\sqrt{\pi}} \int_{x-\alpha}^{x+\alpha} \exp\left(-\frac{t^2}{\delta^2}\right) dt \qquad (2)$$

Figure 11:
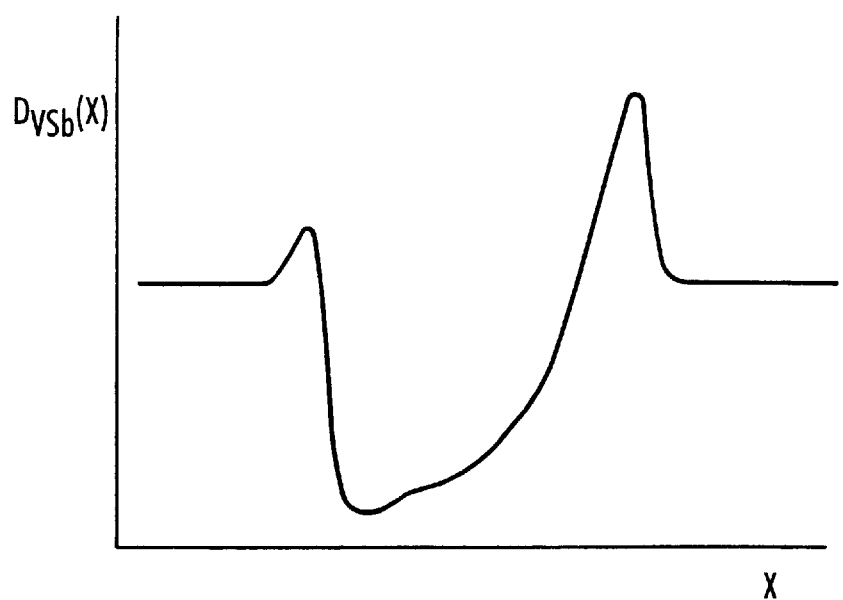
FIG. 11 is a diagram showing an example of a reflected signal waveform actually measured.

The relationship shown by the following expression (3) holds among the waveform VSB (x) at a position where the electron beam reaches the alignment mark obtained by either of the above methods, a reflected signal waveform $D_{vsb}$ (x) as shown in FIG. 11 when the alignment mark is actually scanned by the electron beam, and a reflected signal waveform $D_{impulse}$ (x) when the alignment mark is scanned by an electron beam having a beam size of 0 μm. The integration shown in the expression (3) is generally called convolution of $D_{impulse}$ (x) by VSB (x). In the second embodiment, by carrying out deconvolution (reverse conversion of convolution) of $D_{vsb}$ (x) obtained by measurement, $D_{impulse}$ (x) is calculated. A function $D_{impulse}$ (x) thus obtained corresponds to a reflected signal waveform when the alignment mark is detected using an electron beam having a beam size of 0 μm. More specifically, by processing the calculated reflected signal waveform $D_{impulse}$ (x) with the previously mentioned threshold method or autocorrelation method, the center position of the mark when the beam size is 0 μm can be determined, enabling mark position determination with high accuracy.

$$D_{vsb}(x) = \int_{-\infty}^{\infty} D_{impulse}(x-t) \times VSB(t)dt \qquad (3)$$

Figure 12:
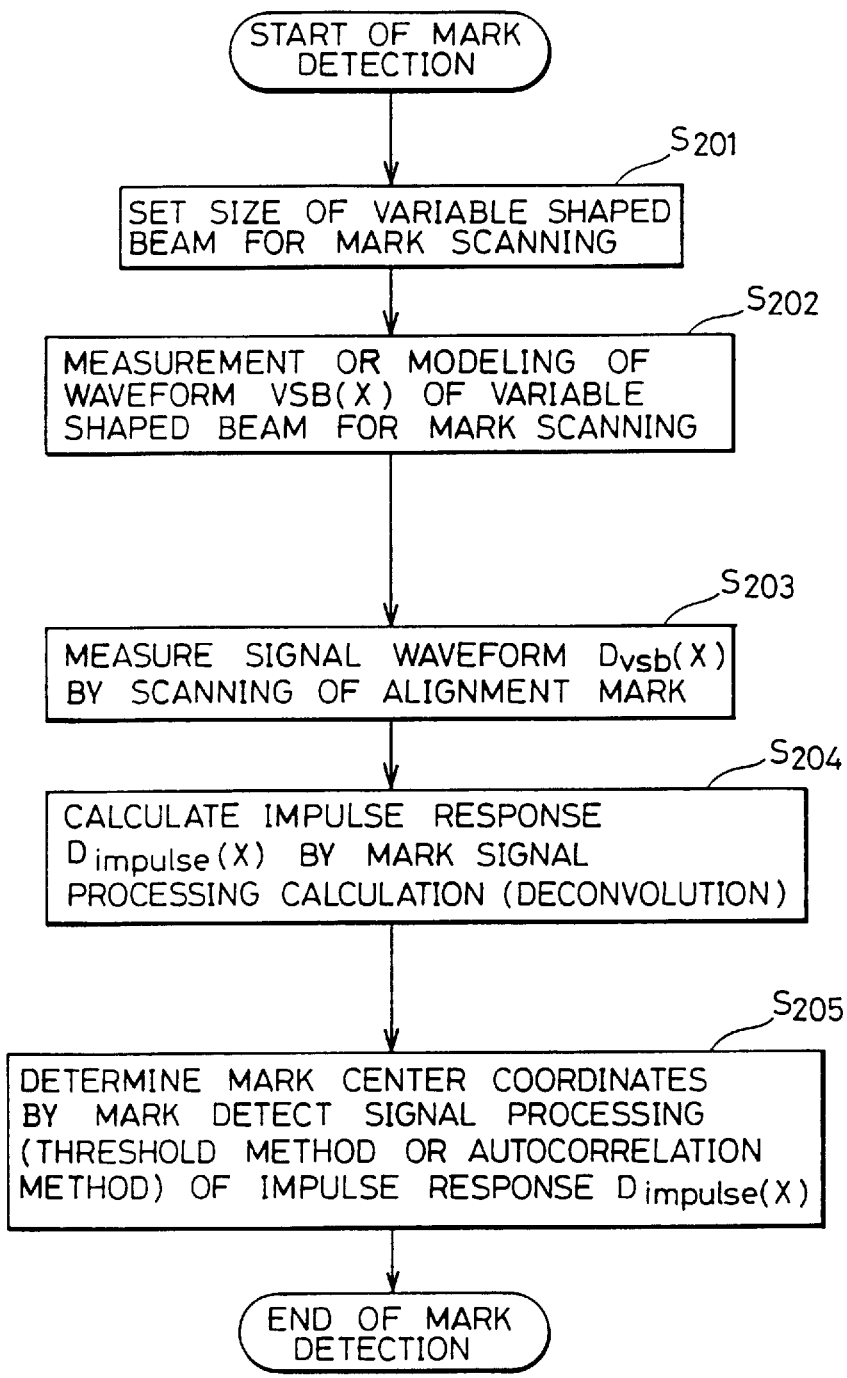
FIG. 12 is a flow chart showing the processing carried out by a control calculator in the second embodiment of the present invention.
Figure 13:
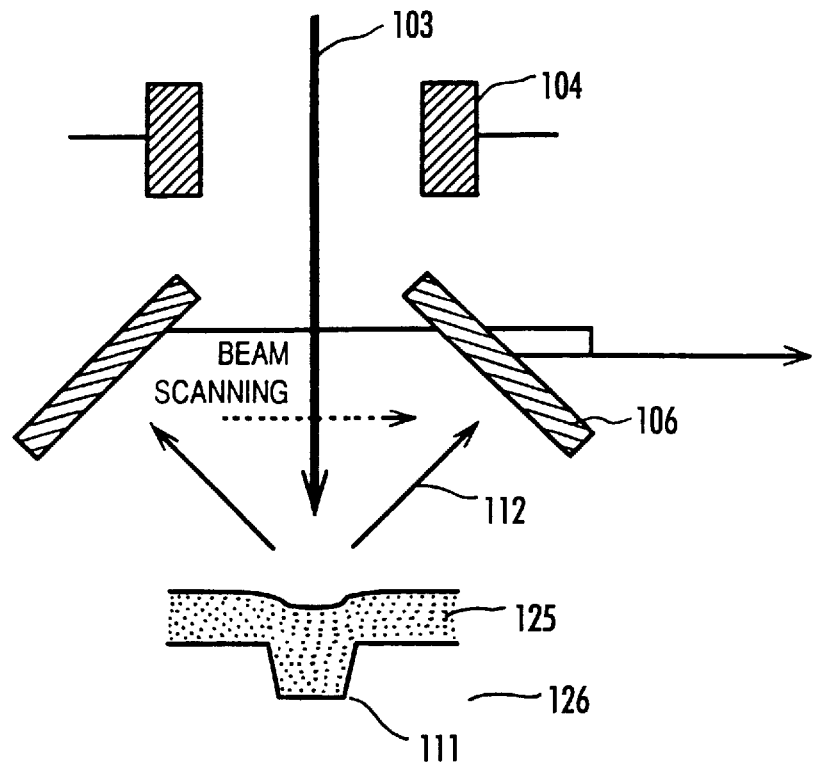
FIG. 13 is a diagram for describing a conventional apparatus determining the position of alignment mark 111.
Figure 14:
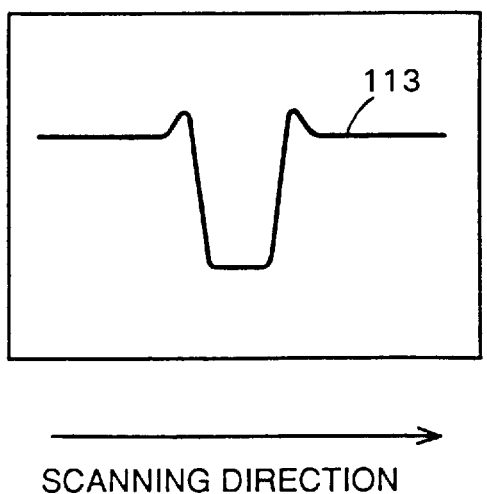
FIG. 14 is a diagram showing a reflected signal waveform obtained by the apparatus shown in FIG. 13.
Figure 15:
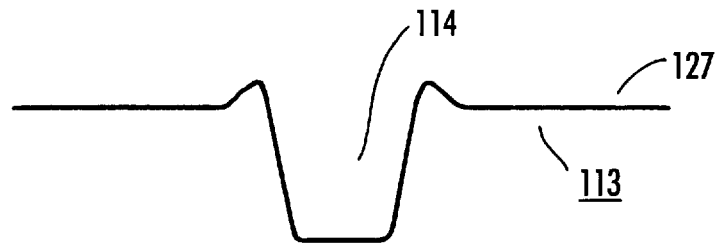
FIG. 15 is a diagram showing an example of a reflected signal waveform.
Figure 16:
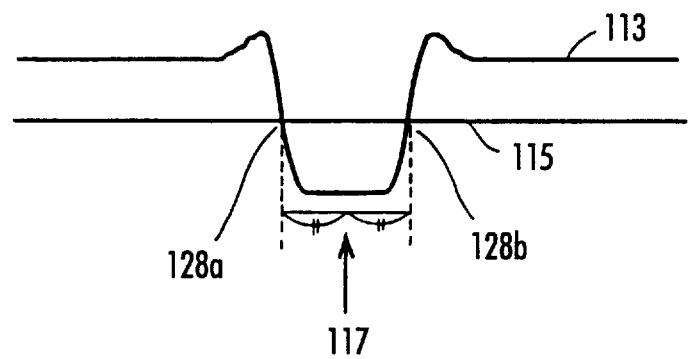
FIG. 16 is a diagram for describing a threshold method carried out based on the reflected signal waveform.
Figure 17:
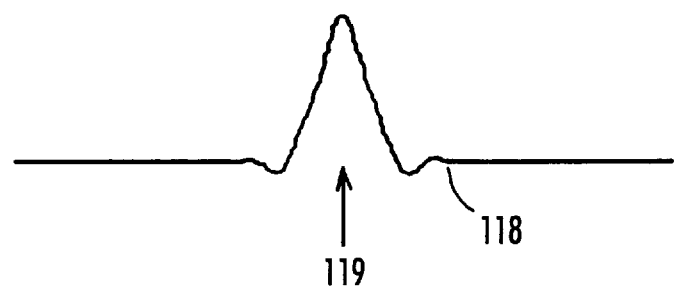
FIG. 17 is a diagram showing an autocorrelation signal obtained from the reflected signal waveform using an autocorrelation method.
Figure 18:
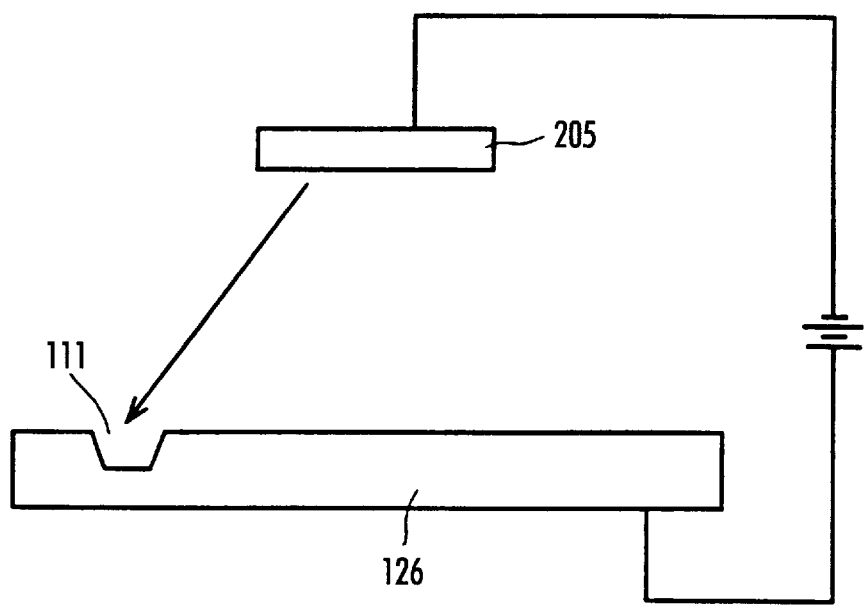
FIG. 18 is a diagram showing the steps of forming a thin film on a silicon substrate.
Figure 19A:
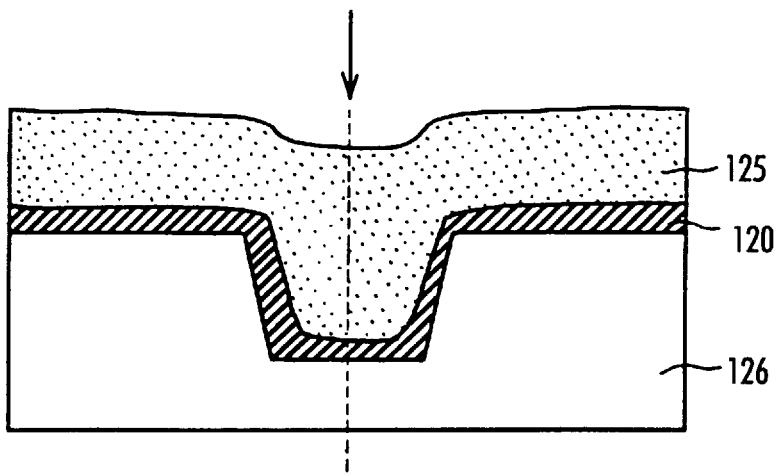
FIG. 19A shows the thin film formed on the silicon substrate.
Figure 19B:
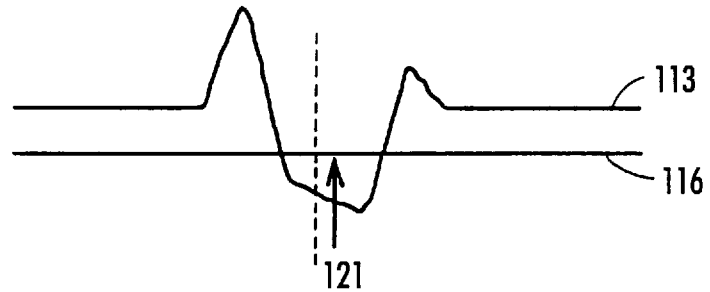
FIGS. 19B and 19C show a measurement error caused by non-uniformity of the film thickness.
Figure 19C:

More specifically, the processing carried out by control calculator 101 in this embodiment is shown in FIG. 12.

When mark position detection is started, the size of an electron beam for mark scanning is set in step S201. This size may be set arbitrarily.

In step S202, the waveform VSB (x) of the electron beam for mark scanning is obtained. In order to obtain the waveform VSB (x), either of the method by actual measurement or the method according to the expression (2) may be used, as previously described.

In step S203, the alignment mark is actually scanned by the electron beam for mark scanning, and the reflected signal waveform $D_{vsb}$ (x) is measured.

In step S204, mark signal processing calculation (deconvolution calculation) is carried out, and the reflected signal waveform (impulse response) $D_{impulse}$ (x) when the size of the electron beam is 0 μm is calculated.

In step S205, by the processing (threshold method or autocorrelation method) of the calculated $D_{impulse}$ (x), the center position of the mark is determined.

In the first embodiment, the alignment mark is scanned by respective beams having a plurality of beam sizes. However, the present invention can be implemented as far as the alignment mark is scanned by beams having at least two kinds of beam sizes.

Although an electron beam is used for scanning of the alignment mark in the above embodiments, the present invention can be implemented by using an ion beam and a laser beam.

Further, the cross section of the beam is square as shown in FIG. 3 in the above embodiments. However, the present invention can be implemented by using a beam having a cross section of a rectangle or a circle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mark position determining apparatus determining the relative position between a mark position on an object and an irradiating beam position, comprising:

first detecting means for detecting a reflected signal wave form reflected from said mark by scanning said mark with an irradiating beam having a first beam size;

second detecting means for detecting a reflected signal waveform reflected from said mark by scanning said mark with an irradiating beam having a second beam size; and determining means for determining the relative position of said mark based on the reflected signal waveform obtained by said first detecting means and the reflected signal waveform obtained by said second detecting means.

2. The mark position determining apparatus according to claim 1, wherein said determining means includes first center position calculating means for calculating the center position of said mark based on the reflected signal waveform obtained by said first detecting means, second center position calculating means for calculating the center position of said mark based on the reflected signal waveform obtained by said second detecting means, and third center position calculating means for calculating the center position of said mark corresponding to an irradiating beam size of 0 based on the center positions of the mark calculated by said first and second center position calculating means, said calculated center position of the mark corresponding to the irradiating beam size of 0 being determined as the position of said mark.

3. The mark position determining apparatus according to claim 2, wherein said first and second center position calculating means each calculates the center position of said mark from the obtained reflected signal waveforms using a predetermined threshold value.

4. The mark position determining apparatus according to claim 2, wherein said first and second center position calculating means calculate the center positions of said mark using an autocorrelation signal calculated based on the obtained reflected signal waveforms.

5. The mark position determining apparatus according claim 2, wherein said beam is an electron beam.

6. The mark position determining apparatus according to claim 1, wherein the mark position determining apparatus is an electron beam exposure apparatus comprising:

an electron gun;

a first aperture comprising a rectangular opening;

a second aperture comprising a rectangular opening; and a beam deflector, located between the first and the second apertures, wherein the beam deflector is configured for controlling beam size, as an electron beam emitted from the electron gun passes through the first aperture to be irradiated to the second aperture, by shifting a position to be irradiated using said deflector.

7. A mark position determining apparatus determining the relative position between a mark position formed on an object and an irradiating beam position, comprising:

detecting means for detecting a reflected signal waveform reflected from said mark by scanning said mark with an irradiating beam;

acquiring means for acquiring a beam shape at a position where said irradiating beam reaches said mark; and determining means for determining the position of said mark based on said detected reflected signal waveform and said acquired beam shape.

8. The mark position determining apparatus according to claim 7, wherein said determining means includes deconvoluting means for deconvoluting said reflected signal waveform based on said acquired beam shape to calculate a reflected signal waveform corresponding to an irradiating beam size of 0, and center position calculating means for calculating the center position of said mark based on said calculated reflected signal waveform corresponding to the irradiating beam size of 0, the center position of the mark calculated by said center position calculating means being determined as the center position of said mark.

9. The mark position determining apparatus according to claim 8, wherein said center position calculating means calculates the center position of said mark from said calculated reflected signal waveform corresponding to the irradiating beam size of 0 using a predetermined threshold value.

10. The mark position determining apparatus according to claim 8 wherein said center position calculating means calculates the center position of said mark using an autocorrelation signal calculated based on said calculated reflected signal waveform corresponding to the irradiating beam size of 0.

11. The mark position determining apparatus according to claim 7, wherein said acquiring means acquires the beam shape at the position where said irradiating beam reaches said mark by measuring the irradiating beam when it arrives at said mark.

12. The mark position determining apparatus according to claim 7, wherein said acquiring means calculates and acquires the irradiating beam shape at the position where said irradiating beam reaches said mark based on the irradiating beam size of said irradiating beam and the amount of gradation of said irradiating beam.

13. The mark position determining apparatus according to claim 7, wherein the mark position determining apparatus is an electron beam exposure apparatus comprising:

an electron gun;

a first aperture comprising a rectangular opening;

a second aperture comprising a rectangular opening; and a beam deflector, located between the first and the second apertures, wherein the beam deflector is configured for controlling beam size, as an electron beam emitted from the electron gun passes through the first aperture to be irradiated to the second aperture, by shifting a position to be irradiated using said deflector.

14. A method for determining a position between a mark position formed on an object and an irradiating beam position, comprising:

a first step of scanning said mark with an irradiating beam having a first beam size to detect a reflected signal waveform reflected from said mark;

a second step of scanning said mark with an irradiating beam having a second beam size to detect a reflected signal waveform reflected from said mark; and a third step of determining the position of said mark based on the reflected signal waveform obtained by said first step and the reflected signal waveform obtained by said second step.

15. A method for determining a position between a mark position on an object and an irradiating beam position, comprising the steps of:

scanning said mark with an irradiating beam to detect a reflected signal waveform reflected from said mark;

acquiring a beam shape at a position where said irradiating beam reaches said mark; and determining the position of said mark based on said detected reflected signal waveform and said acquired beam shape.

16. A method for manufacturing a semiconductor device including determination of a position between a mark position formed on a silicon substrate and an irradiating beam position, comprising:

a first step of scanning said mark with an irradiating beam having a first beam size to detect a reflected signal waveform reflected from said mark;

a second step of scanning said mark with an irradiating beam having a second beam size to detect a reflected signal waveform reflected from said mark; and a third step of determining the position of said mark based on the reflected signal waveform obtained by said first step and the reflected signal waveform obtained by said second step.

17. The method for manufacturing of a semiconductor device according to claim 16, further comprising a step for calculating the center position of said mark from the obtained reflected signal waveforms using a predetermined threshold value.

18. The method for manufacturing of a semiconductor device according to claim 16, further comprising a step for calculating the center position of said mark using an autocorrelation signal calculated based on the obtained reflected signal waveforms.

19. A method for manufacturing a semiconductor device including determination of a position between a mark position on a silicon substrate and an irradiating beam position, comprising the steps of:

scanning said mark with an irradiating beam to detect a reflected signal waveform reflected from said mark;

acquiring a beam shape at a position where said irradiating beam reaches said mark; and determining the position of said mark based on said detected reflected signal waveform and said acquired beam shape.

20. The method for manufacturing of a semiconductor device according to claim 19, further comprising a step for calculating a reflected signal waveform corresponding to an irradiating beam size of 0 and calculating the center position of said mark from said calculated reflected signal waveform corresponding to the irradiating beam size of 0 using a predetermined threshold value.

21. The method for manufacturing of a semiconductor device according to claim 19, further comprising a step for calculating a reflected signal waveform corresponding to an irradiating beam size of 0 and calculating the center position of said mark using an autocorrelation signal calculated based on said calculated reflected signal waveform corresponding to the irradiating beam size of 0.

22. The method for manufacturing of a semiconductor device according to claim 19, further comprising a step for calculating and acquiring the irradiating beam shape at the position where said irradiating beam reaches said mark based on the irradiating beam size of said irradiating beam and the amount of gradation of said irradiating beam.

* * * * *